United States Patent
Zheng et al.

(10) Patent No.: US 9,495,930 B2
(45) Date of Patent: Nov. 15, 2016

(54) SHIFT REGISTER, METHOD FOR DRIVING THE SAME, AND DISPLAY DEVICE

(71) Applicants: BOE TECHNOLOGY GROUP CO., LTD., Beijing (CN);
(Continued)

(72) Inventors: Liangliang Zheng, Beijing (CN); Jian He, Beijing (CN); Tingting Jin, Beijing (CN)

(73) Assignees: BOE TECHNOLOGY GROUP CO., LTD. (CN);
(Continued)

( * ) Notice: Subject to any disclaimer, the term of this patent is extended or adjusted under 35 U.S.C. 154(b) by 35 days.

(21) Appl. No.: 14/416,670

(22) PCT Filed: Jul. 7, 2014

(86) PCT No.: PCT/CN2014/081715
§ 371 (c)(1),
(2) Date: Jan. 23, 2015

(87) PCT Pub. No.: WO2015/096452
PCT Pub. Date: Jul. 2, 2015

(65) Prior Publication Data
US 2015/0339999 A1    Nov. 26, 2015

(30) Foreign Application Priority Data
Dec. 24, 2013 (CN) .......................... 2013 1 0723033

(51) Int. Cl.
*G09G 3/36* (2006.01)
*G11C 19/28* (2006.01)

(52) U.S. Cl.
CPC ............. *G09G 3/3677* (2013.01); *G11C 19/28* (2013.01); *G09G 2310/0286* (2013.01)

(58) Field of Classification Search
None
See application file for complete search history.

(56) References Cited

U.S. PATENT DOCUMENTS

| 2010/0245301 A1* | 9/2010 | Shang ................. G09G 3/3677 345/204 |
| 2012/0032941 A1 | 2/2012 | Chen et al. |
| 2013/0147699 A1 | 6/2013 | Seo et al. |

FOREIGN PATENT DOCUMENTS

| CN | 1941208 A | 4/2007 |
| CN | 101847377 A | 9/2010 |

(Continued)

OTHER PUBLICATIONS

Office Action in Chinese Patent Application No. 201310723033.4, dated Aug. 6, 2015.

(Continued)

*Primary Examiner* — Kenneth B Lee, Jr.
(74) *Attorney, Agent, or Firm* — BakerHostetler LLP

(57) ABSTRACT

A shift register according to the present disclosure may specifically include multi-level shift register units, a first connecting TFT set and a second connecting TFT set. In the multi-level shift register units, control signal input ends of odd-number-level shift register units are inputted with a first control signal and control signal input ends of even-number-level shift register units are inputted with a second control signal. Connecting TFTs in the first connecting TFT set and the second connecting TFT set are configured to achieve an electrical connection between gate electrode signal output ends of odd-number-level shift register units and even-number-level shift register units in the shift register under a control of a control signal transmitted by a timing controller.

20 Claims, 8 Drawing Sheets

(71) Applicants: HEFEI BOE OPTOELECTRONICS TECHNOLOGY CO., LTD., Anhui (CN)

(73) Assignees: HEFEI BOE OPTOELECTRONICS TECHNOLOGY CO., LTD. (CN)

(56) References Cited

FOREIGN PATENT DOCUMENTS

| | | | |
|---|---|---|---|
| CN | 202838908 | U | 3/2013 |
| CN | 103680387 | A | 3/2014 |
| KR | 1020070079852 | A | 8/2007 |
| TW | 201214376 | A | 4/2012 |

OTHER PUBLICATIONS

International Search Report and Written Opinion in PCT International Application No. PCT/CN2014/081715, dated Oct. 10, 2014.

* cited by examiner

Charging, by the pre-charging module, the first capacitor in stage A, during which the pre-charging module is in an ON state, the pulling-up module, the reset control module and the pulling-down module are in an OFF state ─81 controlling, by the pulling-up module, the gate electrode signal output end to output the gate electrode driving signal in stage B, during which the pulling-up module is in an ON state, the pre-charging module, the reset control module and the pulling-down module are in an OFF state ─82 controlling, by the reset control module, the pulling-down module to be in an OFF state in stage C, during which the reset control module is in an ON state, the pre-charging module and the pulling-up module are in an OFF state, and the connecting TFT is in an ON state so that the gate electrode signal output end is electrically connected with the gate electrode signal output ends of other shift register units ─83 controlling, by the pulling-down module, to pull down a potential of the gate electrode signal output end and to discharge the first capacitor, in stage D, during which the reset control module and the pulling-down module are in an ON state, the pre-charging module and the pulling-up module are in an OFF state ─84

Fig. 8

SHIFT REGISTER, METHOD FOR DRIVING THE SAME, AND DISPLAY DEVICE

CROSS-REFERENCE TO RELATED APPLICATION

This application is the U.S. national phase of PCT Application No. PCT/CN2014/081715 filed on Jul. 7, 2014, which claims priority to Chinese Patent Application No. 201310723033.4 filed on Dec. 24, 2013, the disclosures of which are incorporated in their entirety by reference herein.

TECHNICAL FIELD

The present disclosure relates to the field of display technology, in particular to a shift register, a method for driving the same and a display device.

BACKGROUND

In recent years, along with the rapid development of semiconductor technology, portable electronics and plane display products also become popular. Furthermore, thin film transistor (TFT) liquid crystal display (LCD) devices have become standard output devices for variety of data products since they have advantages such as a low operation voltage, no radiation scattering, a light weight and a small size, etc.

The TFT LCD device is generally formed by a pixel matrix aligned in both horizontal and vertical directions. When the TFT LCD device is displaying, gate electrode input signals are generated by a shift register, and each row of pixels are scanned from the first row to the last row sequentially. In the design of the TFT LCD device, there needs to design an appropriate shift register, to ensure its stability. Typically, the shift register is composed of multi-level shift register units connected in series wherein an output signal of a previous shift register unit is an input signal of a next level shift register unit.

In order to lower the manufacturing cost of the TFT LCD device, a multi-level amorphous silicon shift register is formed directly on a glass substrate of a panel by an amorphous silicon technology in the related art, in order to replace the well-known conventional gate driver, so as to achieve the object of lowering the manufacturing cost of the LCD device.

However, if an amorphous silicon material TFT is used, when it is subjected to voltage stresses, a threshold voltage thereof will be shifted, so that the driving capability of the TFT will deteriorate and thus the life of the LCD device will be shortened. Therefore, in the design of a circuit of an amorphous silicon shift register, it is desired to reduce the shifting of the threshold voltage of the TFT to ensure the shift register to work properly, i.e., to drive the entire liquid crystal panel normally, during the life of the LCD device. At the same time, within each frame time, when each row of the gate electrode output signals is set, the Gate on array (GOA) unit is charged to a high potential (VGH) by a clock signal (CLK); and when the scanning of this line is finished, the GOA unit is discharged to a low potential (VGL).

In a conventional structure of the shift register unit, in order to ensure that the shift register unit performs a normal signal output function, the internal TFTs are needed to be in a conductive (ON) state for a longer time, causing a power consumption of the shift register unit increased. Furthermore, with respect to the conventional shift register unit, in a half time of each frame, the gate electrode signal output end is pulled down; and in the other half time, the gate electrode signal output end is floating, which makes a higher noise existing in the conventional shift register unit and brings certain damage to the shift register circuit.

SUMMARY

Technical Problem to be Solved

The present disclosure provides a shift register, a method for driving the same and a display device, which can shorten floating time of a gate electrode signal output end of the shift register unit, and decrease noise and power consumption of the shift register.

Technical Solutions

The technical solutions provided by embodiments of the present disclosure are as follows.

An embodiment of the present disclosure provides a shift register including:

multi-level shift register units, in which control signal input ends of odd-number-level shift register units are inputted with a first control signal and control signal input ends of even-number-level shift register units are inputted with a second control signal;

a first connecting thin film transistor (TFT) set, in which first electrodes of the TFTs in the first connecting TFT set are connected to gate electrode signal output ends of the odd-number-level shift register units, gate electrodes of TFTs in the first connecting TFT set are connected to a timing controller and configured to receive the first control signal transmitted by the timing controller, second electrodes of the TFTs in the first connecting TFT set are connected to gate electrode signal output ends of the even-number-level shift register units; and a second connecting TFT set, in which first electrodes of the TFTs in the second connecting TFT set are connected to gate electrode signal output ends of the even-number-level shift register units, gate electrodes of TFTs in the second connecting TFT set are connected to the timing controller and configured to receive the second control signal transmitted by the timing controller, second electrodes of the TFTs in the second connecting TFT set are connected to gate electrode signal output ends of the odd-number-level shift register units.

Furthermore, each shift register unit in the multi-level shift register units may further include:

a first capacitor, a pre-charging module, a pulling-up module, a reset control module and a pulling-down module; wherein the pre-charging module is connected to a start signal input end, the pulling-down module, a first end of the first capacitor, the pulling-up module respectively, configured to pre-charge the first capacitor in a first stage;

the pulling-up module is connected to a first clock signal input end, the first capacitor, the pre-charging module, the pulling-down module and the gate electrode signal output end respectively, and configured to control the gate electrode signal output end to output a gate electrode driving signal in a second stage;

the reset control module is connected to a reset signal input end, a control signal input end, a first level signal input end, the pulling-down module respectively, and configured to control the pulling-down module to be in an OFF state in a third stage;

the pulling-down module is connected to a second clock signal input end, the first level signal input end, the gate electrode signal output end, the pre-charging module, the first capacitor, the pulling-up module and the reset control module respectively, and configured to control pulling down a potential of the gate electrode signal output end and discharging the first capacitor in a fourth stage.

Furthermore, the pre-charging module may further include:

a first TFT, a first electrode and a gate electrode of which are connected to the start signal input end, and a second electrode of which is connected to the first end of first capacitor, the pulling-up module and the pulling-down module respectively.

Furthermore, the pulling-up module may include:

a third TFT, a first electrode of which is connected to the first clock signal input end, a gate electrode of which is connected to the first end of the first capacitor, the pre-charging module and the pulling-down module respectively, and a second electrode of which is connected to the gate electrode signal output end, a second end of the first capacitor and the pulling-down module respectively.

Furthermore, the reset control module may include:

a twelfth TFT, a thirteenth TFT, a fourteenth TFT and a fifteenth TFT; wherein a first electrode and a gate electrode of the twelfth TFT are connected to the reset signal input end, a second electrode of the twelfth TFT is connected to a gate electrode of the thirteenth TFT and a first electrode of the fourteenth TFT respectively;

a first electrode of the thirteenth TFT is connected to the reset signal input end; a second electrode of the thirteenth TFT is connected to a first electrode of the fifteenth TFT and the pulling-down module respectively;

a gate electrode of the fourteenth TFT is connected to the control signal input end, a second electrode of the fourteenth TFT is connected to the first level signal input end;

a gate electrode of the fifteenth TFT is connected to the control signal input end, a second electrode of the fifteenth TFT is connected to the first level signal input end.

Furthermore, the pulling-down module may include:

a second TFT, a fourth TFT, a fifth TFT, a sixth TFT, an eighth TFT, a ninth TFT, a tenth TFT and an eleventh TFT; wherein a first electrode of the second TFT is connected to a gate electrode of the sixth TFT, a gate electrode of the eighth TFT, the pre-charging module, the first end of the first capacitor and the pulling-up module respectively, a gate electrode of the second TFT is connected to the reset control module, and a second electrode of the second TFT is connected to the first level signal input end;

a first electrode of the fourth TFT is connected to the pulling-up module, a second end of the first capacitor and the gate electrode signal output end respectively, a gate electrode of the fourth TFT is connected to the reset control module, and a second electrode of the fourth TFT is connected to the first level signal input end;

a first electrode of the fifth TFT is connected to the second clock signal input end, a gate electrode of the fifth TFT is connected to a first electrode of the eighth TFT and a second electrode of the ninth TFT respectively, and a second electrode of the fifth TFT is connected to a first electrode of the sixth TFT, a gate electrode of the tenth TFT and a gate electrode of the eleventh TFT respectively;

a second electrode of the sixth TFT is connected to the first level signal input end;

a second electrode of the eighth TFT is connected to the first level signal input end;

a first electrode and a gate electrode of the ninth TFT are connected to the second clock signal input end;

a first electrode of the tenth TFT is connected to the gate electrode of the sixth TFT, the gate electrode of the eighth TFT, the pre-charging module, the first end of the first capacitor and the pulling-up module respectively, and a second electrode the tenth TFT is connected to the first level signal input end;

a first electrode of the eleventh TFT is connected to the pulling-up module, the second end of the first capacitor and the gate electrode signal output end respectively, and a second electrode of the eleventh TFT is connected to the first level signal input end.

Furthermore, all the TFTs may be N-type TFTs, the first electrode of each of the TFTs may be a source electrode and the second electrode of each of the TFTs may be a drain electrode.

Furthermore, the first level signal input end may input a low level signal.

Furthermore, the shift register may further include:

a switching TFT, a first electrode of which is connected to a second level signal input end, a gate electrode of which is connected to the timing controller and configured to receive a third control signal transmitted by the timing controller, and a second electrode of which is connected to the gate electrode signal output end of a first level shift register unit within the multi-level shift register units.

Furthermore, the first control signal may be a first chip select signal, the second control signal may be a second chip select signal, and the third control signal may be a shutdown reset signal;

the second level signal input end may input a high level signal,

An embodiment of the present disclosure further provides a method for driving the above shift register, the method including:

inputting, by a first clock signal input end, a high level signal; inputting, by a second clock signal input end, a low level signal; outputting, by a gate electrode signal output end of a first shift register unit, a gate electrode driving signal; and outputting, by gate electrode signal output ends of a second shift register unit and a third shift register unit, a low level signal, in a first stage, during which thin film transistors (TFTs) in the first connecting TFT set and the second connecting TFT set are in an OFF state;

achieving an electrical connection between the gate electrode signal output end of the first shift register unit and the gate electrode signal output end of the second shift register unit; and outputting, by the gate electrode signal output end of the third shift register unit, a low level signal, in a second stage, during which TFTs of the first connecting TFT set are in an ON state while TFTs of the second connecting TFT set are in an OFF state, and the first clock signal input end and the second clock signal input end are in a high resistance state;

inputting, by the first clock signal input end, a low level signal; inputting, by the second clock signal input end, a high level signal; outputting, by the gate electrode signal output end of the second shift register unit, the gate electrode driving signal; and outputting, by gate electrode signal output ends of the first shift register unit and the third shift register unit, a low level signal, in a third stage, during which TFTs in the first connecting TFT set and the second connecting TFT set are in an OFF state;

outputting, by the gate electrode signal output end of the first shift register unit, a low level signal; and achieving an electrical connection between the gate electrode signal output end of the second shift register unit and the gate electrode signal output end of the third shift register unit, in a fourth stage, during which TFTs in the first connecting TFT set are in an OFF state while TFTs in the second connecting TFT set are in an ON state, and the first clock signal input end and the second clock signal input end are in a high resistance state.

Furthermore, the method may further include setting the first control signal, the second control signal and the third control signal which are transmitted by the timing controller to be high level signals simultaneously, when the timing controller detects that an input power supply has a value lower than a predetermined value.

An embodiment of the present disclosure further provides a display device, including the above shift register.

The Advantageous Effects

An embodiment of the present disclosure has at least the advantages as follows.

As can be seen from the above, according to the shift register, the method for driving the same, and the display device provided by the present disclosure, the shift register may specifically include multi-level shift register units, the first connecting TFT set and the second connecting TFT set. In the multi-level shift register units, control signal input ends of odd-number-level shift register units are inputted with the first control signal and control signal input ends of even-number-level shift register units are inputted with the second control signal; the connecting TFTs in the first connecting TFT set and the second connecting TFT set are configured to achieve the electrical connection between the gate electrode signal output ends of odd-number-level shift register units and even-number-level shift register units in the shift register under the control of the control signal transmitted by the timing controller, thereby shortening floating time of the gate electrode signal output end of the shift register unit, and lower noise and power consumption of the shift register.

BRIEF DESCRIPTION OF THE DRAWINGS

In order to more clearly illustrate the technical solutions according to the embodiments of the present disclosure or the related art, accompany drawings acquired to use in the description of the embodiments will be described briefly below. It is obvious that, the described drawings are merely parts of embodiments of the present disclosure, and other drawings can also be obtained according to these drawings for a person skilled in the art without creative work.

FIG. 8 is a flow chart showing a method for driving a shift register unit according to an embodiment of the present disclosure.

DETAILED DESCRIPTION

Embodiments of the present disclosure will be further described below in conjunction with the accompanying drawings and examples. The following embodiments are merely used to illustrate the present disclosure, but not intended to limit the scope of the present invention.

In order to make the objects, technical solutions and advantages of the embodiments of the present disclosure more clear, the technical solutions according to the embodiments of the present disclosure will be clearly and fully described hereinafter in conjunction with the accompanying drawings in the embodiments of the present disclosure. Obviously, the described embodiments are merely parts of embodiments of the present disclosure, but not all the embodiments. Based on the embodiments in the present disclosure, all the other embodiments obtained by a person skilled in the art will fall within the protection scope of the present disclosure.

Unless otherwise defined, technical terms or scientific terms used herein shall have the general meaning which can be understood by a person skilled in the art. The terms "first", "second" or the like used in the specification and claims of the present disclosure do not denote any sequence, quantity, or importance, but rather are used to distinguish different components. Similarly, the terms "a" or "an" or the like do not mean quantitative restrictions, but rather indicate the presence of at least one. The terms "connect" or "couple" or the like are not limited to connect physically or mechanically, but may include connecting electrically either directly or indirectly. The terms "up", "down", "left", "right", etc., are merely used to indicate a relative positional relationship; when the absolute position of the described object is changed, the relative positional relationship is changed correspondingly.

Figure 1:
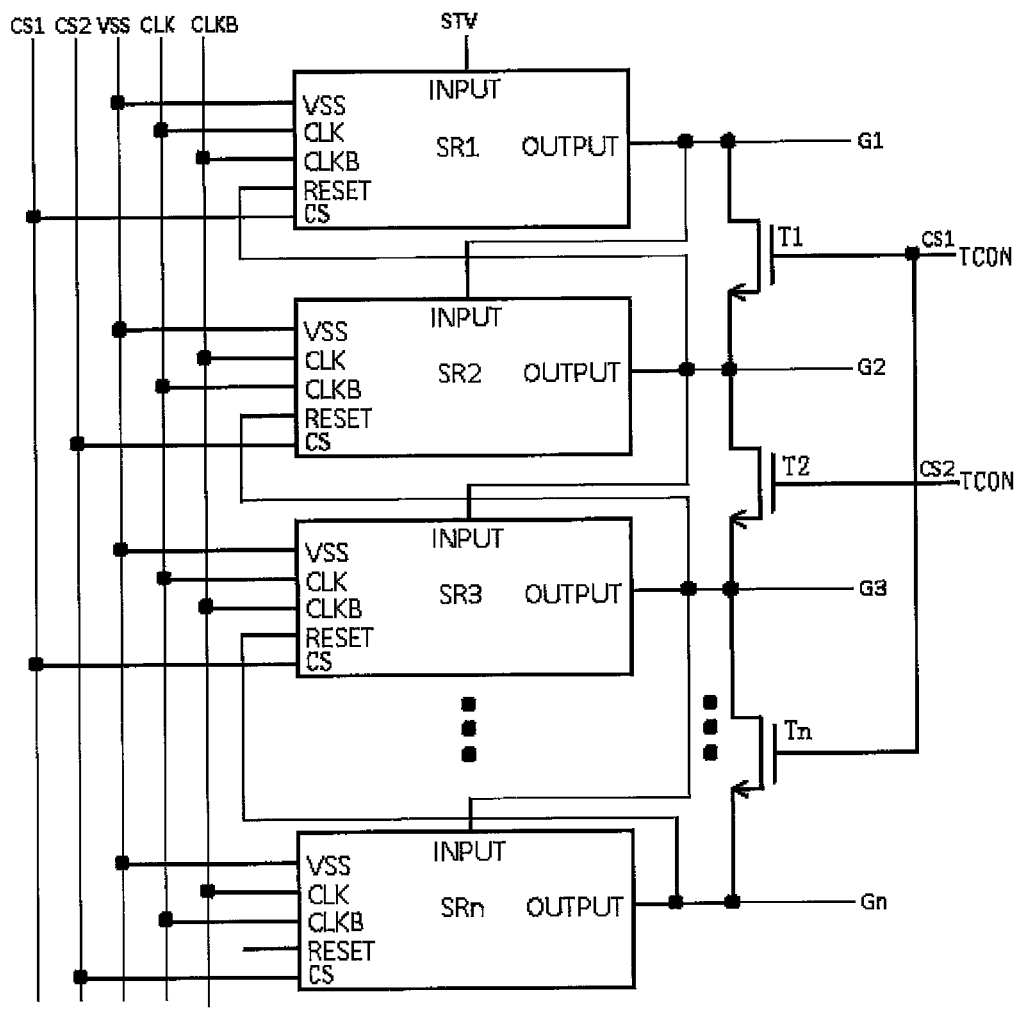
FIG. 1 is a diagram showing a first structure of a shift register according to an embodiment of the present disclosure.

An embodiment of the present disclosure provides a shift register. As shown in FIG. 1, specifically, the shift register may include:

multi-level shift register units (SRn), in which control signal input ends of odd-number-level shift register units are inputted with a first control signal and control signal input ends of even-number-level shift register units are inputted with a second control signal;

a first connecting thin film transistor (TFT) set (which may specifically include connecting TFTs T1, T3 and the like as shown in FIG. 1), in which first electrodes of the TFTs in the first connecting TFT set are connected to gate electrode signal output ends of the odd-number-level shift register units, gate electrodes of TFTs in the first connecting TFT set are connected to a timing controller (TCON) and configured to receive the first control signal transmitted by the timing controller, second electrodes of the TFTs in the first connecting TFT set are connected to gate electrode signal output ends of the even-number-level shift register units;

a second connecting TFT set (which may specifically include connecting TFTs T2 and the like as shown in FIG. 1), in which first electrodes of the TFTs in the second connecting TFT set are connected to gate electrode signal output ends of the even-number-level shift register units, gate electrodes of TFTs in the second connecting TFT set are connected to the timing controller and configured to receive the second control signal transmitted by the timing controller, second electrodes of the TFTs in the second connecting TFT set are connected to gate electrode signal output ends of the odd-number-level shift register units.

Since different shift register units involved in the embodiment of the present disclosure may be connected by connecting TFTs, it can be achieved that the gate electrode signal output ends of different shift register units can share the electric charges when the connecting TFTs are of an ON state under the control of the control signal, especially after a gate electrode signal output end of a shift register unit outputs a gate electrode driving signal (that is, a high level signal), a potential of the gate electrode signal output end of the shift register unit can be reduced in a manner of sharing the electric charges, thereby lowering the power consumption of the shift register on one hand and shortening the floating time of the gate electrode signal output end and reducing the noise of the shift register unit on the other hand.

As shown in FIG. 1, in a specific embodiment, the connecting TFT T1 can be the TFT in the first connecting TFT set. It can be seen that, a first electrode of the connecting TFT T1 is connected to a gate electrode signal output end of a first level shift register unit (that is, a first odd-number-level shift register unit); a second electrode of the connecting TFT T1 is connected to a gate electrode signal output end of a first level shift register unit (that is, a first even-number-level shift register unit); and a gate electrode of the connecting TFT T1 is configured to receive the first control signal transmitted by the timing controller.

Similarly, as shown in FIG. 1, the connecting TFT T2 can be the TFT in the second connecting TFT set. It can be seen that, a first electrode of the connecting TFT T2 is connected to a gate electrode signal output end of a second level shift register unit (that is, a first even-number-level shift register unit); a second electrode of the connecting TFT T2 is connected to a gate electrode signal output end of a third level shift register unit (that is, a second odd-number-level shift register unit); and a gate electrode of the connecting TFT T2 is configured to receive the second control signal transmitted by the timing controller.

It should be noted that, the shift register units connected by the connecting TFT T1 and the connecting TFT T2 as shown in FIG. 1 are adjacent odd-number-level and even-number-level shift register units, however, in another embodiment, the shift register units connected by connecting TFTs may be non-adjacent shift register units. Shift registers connected by connecting TFTs may be both odd-number-level shift registers or both even-number-level shift registers, as long as the electrical connection, i.e., the electric charge sharing, between gate electrode signal output ends of different shift register units can be achieved under the control of the control signal.

Specifically, the control signal involved in the embodiment may be a chip select (CS) signal or other signals.

Figure 2:
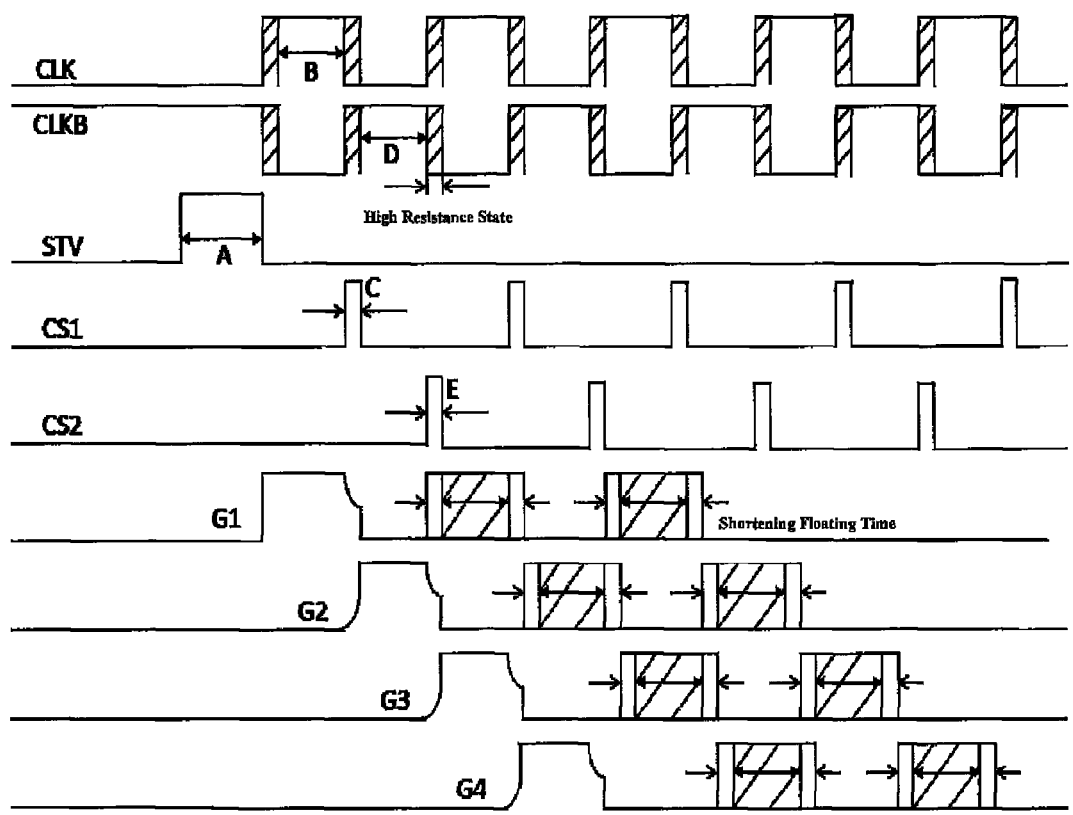
FIG. 2 is a diagram showing a first timing sequence of input signals of a shift register according to an embodiment of the present disclosure.

Specifically, a timing sequence diagram of the input signal involved in the shift register may be as shown in FIG. 2.

The specific working process of the shift register will be described below in detail in conjunction with the signal inputting timing sequence diagram shown in FIG. 2.

Before the first control signal CS1 is effective, that is, in a first stage (stage B as shown in FIG. 2), the first clock signal (CLK) is of a high level, and the second clock signal (CLKB) is of a low level. At this time, a first level shift register unit (that is, a first level odd-number-level shift register unit) in the shift register outputs the gate electrode driving signal, and all the odd-number-level and even-number-level shift register units which are not set units in the shift register (for example, SR2, SR3) output low level signals. When CS1 is effective (that is, of a high level signal), that is, in a second stage (stage C as shown in FIG. 2), connecting TFTs (for example, T1, T3) in the first connecting TFT set connected between the gate electrode signal output ends of shift register units SR1 and SR2, SR3 and SR4, SR5 and SR6, and so on, are in an ON state, thereby being possible to pull the electric potential of gate electrode signal output ends of odd-number-level shift register units down to a low level in a sharing manner (because at this time, gate electrode signal output ends of even-number-level shift register units are of a low level), thereby shortening the floating time of gate electrode signal output ends of odd-number-level shift register units by using a lower power consumption and reducing the noise of the shift register.

Before the second control signal CS2 is effective, that is, in a third stage (stage D as shown in FIG. 2), the first clock signal (CLK) is of a low level, and the second clock signal (CLKB) is of a high level. At this time, a second level shift register unit (that is, a first level even-number-level shift register unit) in the shift register outputs the gate electrode driving signal and all the odd-number-level and even-number-level shift register units which are not set units in the shift register (for example, SR1, SR3) output low level signals. When CS2 is effective (that is, of a high level signal), that is, in a fourth stage (stage E as shown in FIG. 2), connecting TFTs (for example, T2) in the second connecting TFT set connected between the gate electrode signal output ends of shift register units SR2 and SR3, SR4 and SR5, SR6 and SR7, and so on, are in an ON state, thereby being possible to pull the electric potential of gate electrode signal output ends of even-number-level shift register units down to a low level in a sharing manner (because at this time, gate electrode signal output ends of odd-number-level shift register units are of a low level), thereby shortening the floating time of gate electrode signal output ends of even-number-level shift register units by using a lower power consumption and reducing the noise of the shift register.

The above steps can be repeated to achieve the outputs of gate electrode driving signals of all the shift register units in the shift register and the electric charge sharing operation.

It can be seen that, in a specific embodiment of the present disclosure, when the odd-number-level shift register units are in the second stage, the first control signal CS1 is of a high level signal, the second control signal CS2 is of a low level signal, At this time, the gate electrode signal output ends of the odd-number-level shift register units and the gate electrode signal output ends of the even-number-level shift register units (for example, G1 and G2, G3 and G4, G5 and G6, and so on) are shorted, thereby achieving the electric charge sharing. The gate electrode signal output ends of the odd-number-level shift register units share their corresponding electric charge state (for example, VGH, VGL) to the even-number-level shift register units.

When the even-number-level shift register units are in the fourth stage, the first control signal CS1 is of a low level signal, the second control signal CS2 is of a high level signal. At this time, gate electrode signal output ends of the even-number-level shift register units and gate electrode signal output ends of odd-number-level shift register units (for example, G2 and G3, G4 and G5, G6 and G7 and so on) are shorted, thereby achieving electric charge sharing. The gate electrode signal output ends of the even-number-level shift register units share their corresponding electric charge state (for example, VGH, VGL) to the odd-number-level shift register units.

Figure 3:
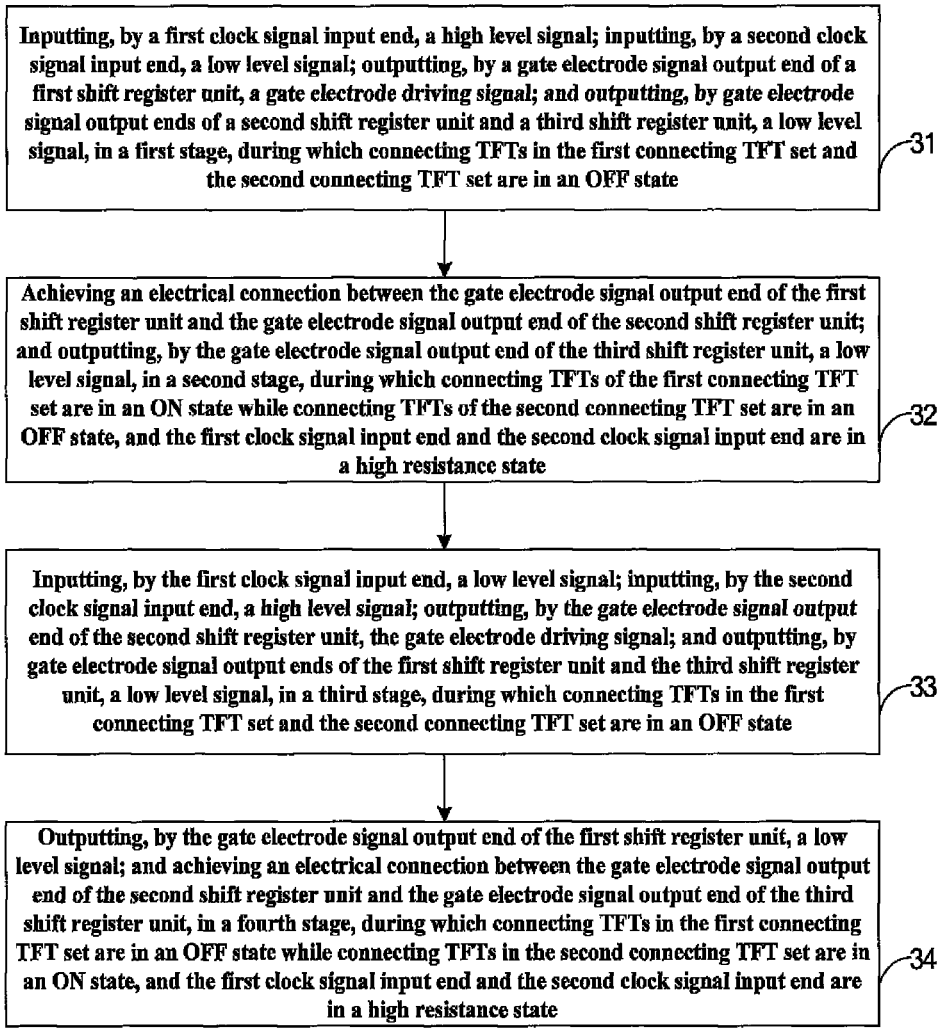
FIG. 3 is a flow chart showing a method for driving a shift register according to an embodiment of the present disclosure.

An embodiment of the present disclosure further provides a method for driving the shift register. As shown in FIG. 3, the method may include:

Step 31, inputting, by a first clock signal input end (CLK), a high level signal; inputting, by a second clock signal input end (CLKB), a low level signal; outputting, by a gate electrode signal output end of a first shift register unit, a gate electrode driving signal; and outputting, by gate electrode signal output ends of a second shift register unit and a third shift register unit, a low level signal, in a first stage, during which connecting TFTs in the first connecting TFT set and the second connecting TFT set are in an OFF state;

Step 32, achieving an electrical connection between the gate electrode signal output end of the first shift register unit and the gate electrode signal output end of the second shift register unit; and outputting, by the gate electrode signal output end of the third shift register unit, a low level signal, in a second stage, during which connecting TFTs of the first connecting TFT set are in an ON state while connecting TFTs of the second connecting TFT set are in an OFF state, and the first clock signal input end and the second clock signal input end are in a high resistance state (Hi-Z);

Step 33, inputting, by the first clock signal input end, a low level signal; inputting, by the second clock signal input end, a high level signal; outputting, by the gate electrode signal output end of the second shift register unit, the gate electrode driving signal; and outputting, by gate electrode signal output ends of the first shift register unit and the third shift register unit, a low level signal, in a third stage, during which connecting TFTs in the first connecting TFT set and the second connecting TFT set are in an OFF state;

Step 34, outputting, by the gate electrode signal output end of the first shift register unit, a low level signal; and achieving an electrical connection between the gate electrode signal output end of the second shift register unit and the gate electrode signal output end of the third shift register unit, in a fourth stage, during which connecting TFTs in the first connecting TFT set are in an OFF state while connecting TFTs in the second connecting TFT set are in an ON state, and the first clock signal input end and the second clock signal input end are in a high resistance state.

Figure 4:
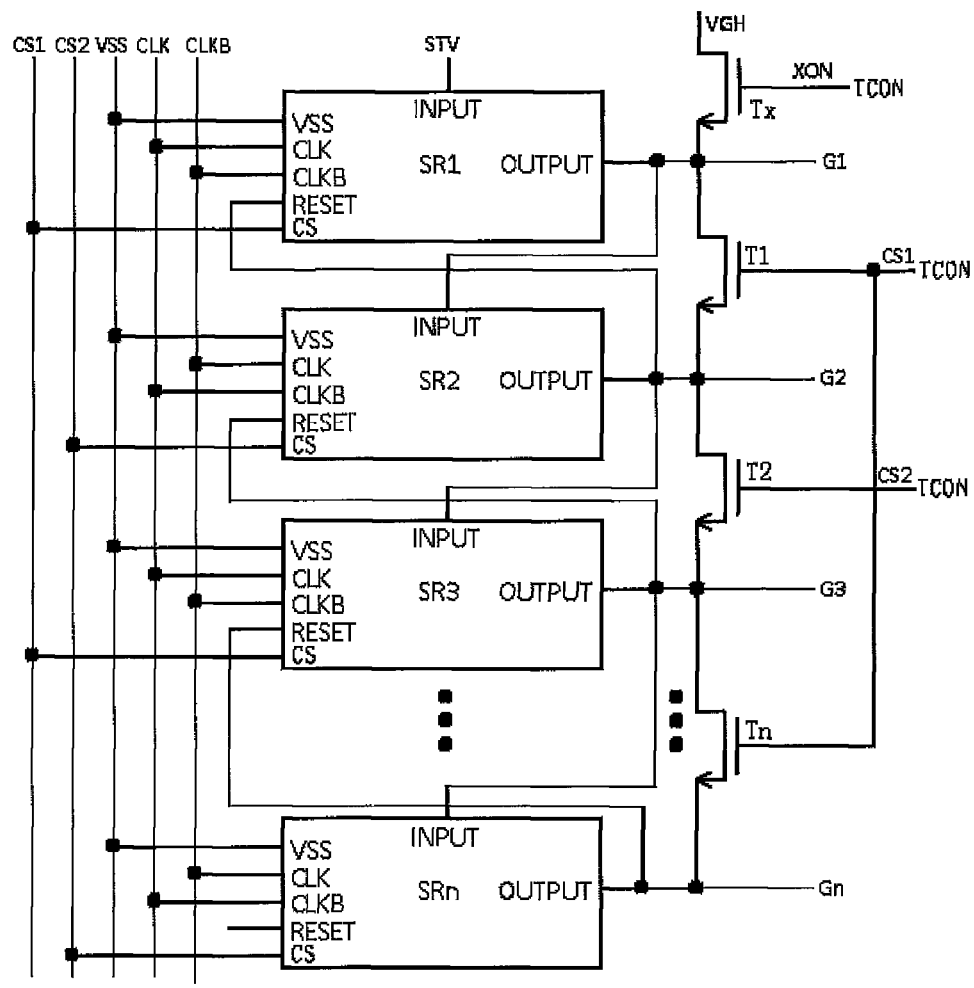
FIG. 4 is a diagram showing a second structure of a shift register according to an embodiment of the present disclosure.

As shown in FIG. 4, in another embodiment of the present disclosure, the shift register may further include:

a switching TFT Tx, a first electrode of which is connected to a second level signal input end, a gate electrode of which is connected to the timing controller (or other controller) and configured to receive a third control signal transmitted by the timing controller, and a second electrode of which is connected to the gate electrode signal output end of the first level shift register unit within the shift register.

In a specific embodiment of the present disclosure, the third control signal may be a shutdown reset signal (XON) and the signal inputted by the second level signal input end may be a high level signal, for example, VGH.

That the switching TFT Tx is arranged in the shift register is because that at the moment when a display device is shutdown, electric charges in a storage capacitor (SOURCE) inside a display panel cannot be released, thereby causing that there still exists display residue on the display panel after the shutdown and showing blurs.

Figure 5:
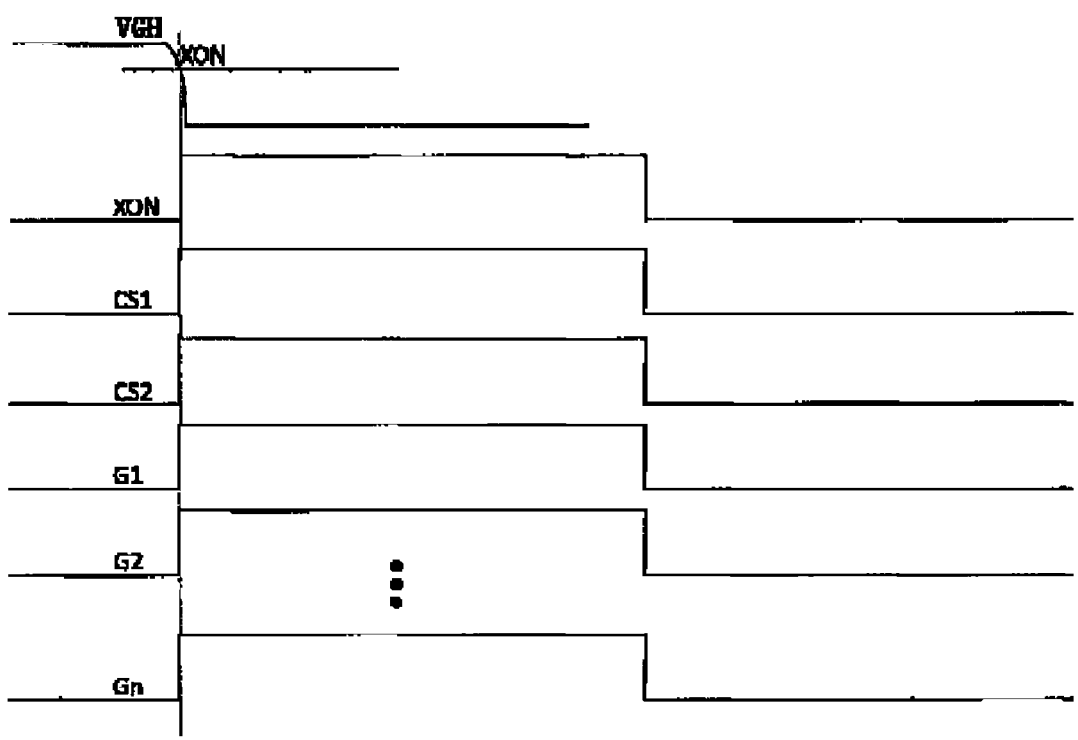
FIG. 5 is a diagram showing a second timing sequence of input signals of a shift register according to an embodiment of the present disclosure.

However, in the embodiment of the present disclosure, at the moment when a display device is shutdown, that is, when the timing controller detects an input voltage of a power source system of the display device being lower than a predetermined value, the timing controller sets the first control signal, the second control signal and the third control signal simultaneously, that is, sets them as high level signals, thus all the connecting TFTs and the switching TFT Tx involved in the embodiments of the present disclosure are simultaneously in an ON state. At this time, in the shift register, gate electrode signal output ends of all the shift register units are shorted together, and connected to VGH, so that gate electrode signal output ends of all the TFT units are in a pulling-up state (that is, outputting high level VGH, the a schematic diagram of whose potential is as shown in FIG. 5. When all the shift register circuits output the high level, gate electrode TFTs inside the display panel are turned on, the electric charges on the SOURCE capacitor is quickly released, so that the display residue will not appear on the display panel, thereby achieving blur elimination when the display device is shutdown.

As shown in FIG. 1, in an embodiment of the present disclosure, the shift register unit may include signal input ends and signal output ends, such as a start signal input end (INPUT), a first level signal input end (VSS), a first clock signal input end (CLK), a second clock signal input end (CLKB), a reset signal input end (RESET), a control signal input end (CS) and gate electrode signal output ends (OUTPUT) and so on.

The composition and process of the shift register unit and the shift register according to an embodiment of the present disclosure will be described below in detail in conjunction with the accompanying drawings.

Figure 6:
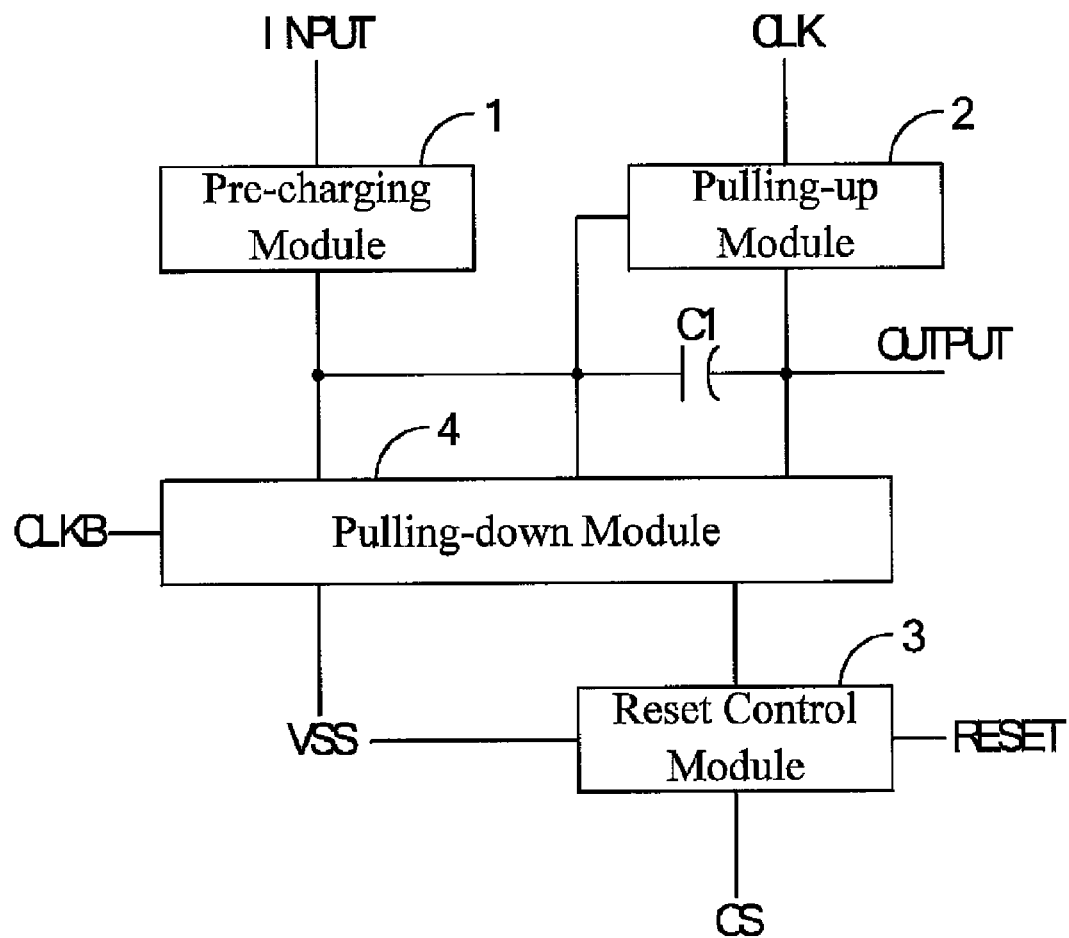
FIG. 6 is a diagram showing a first structure of a shift register unit according to an embodiment of the present disclosure.

As shown in FIG. 6, the shift register unit may specifically include:

a first capacitor C1, a pre-charging module 1, a pulling-up module 2, a reset control module 3, a pulling-down module 4; wherein:

the pre-charging module 1 is connected to the start signal input end, the pulling-down module 4, a first end of the first capacitor C1, the pulling-up module 2 respectively, configured to pre-charge the first capacitor C1 in Stage A;

the pulling-up module 2 is connected to the first clock signal input end, the first capacitor C1, the pre-charging module 1, the pulling-down module 4 and the gate electrode signal output end respectively, and configured to control the gate electrode signal output end to output a gate electrode driving signal in Stage B (that is, the first stage);

the reset control module 3 is connected to the reset signal input end, the control signal input end, the first level signal input end, the pulling-down module 4 respectively, and configured to control the pulling-down module 4 to be in an OFF state in Stage C (that is, the second stage);

the pulling-down module 4 is connected to the second clock signal input end, the first level signal input end, the gate electrode signal output end, the pre-charging module 1, the first capacitor C1, the pulling-up module 2 and the reset control module 3 respectively, and configured to control pulling down a potential of the gate electrode signal output end and discharging the first capacitor C1 in Stage D (that is, the third stage).

In the shift register unit according to the present disclosure, the pulling-down module 4 can be controlled by the reset control module 3 to be in an OFF state in the stage after the gate electrode signal output end outputs the gate electrode driving signal (at this time, connecting TFTs are in an ON state, the gate electrode signal output end are electrically connected to gate electrode signal output ends of other shift register units to achieve the electric charge sharing, that is, potential pulling down), thereby shortening the time during which TFTs in the shift register unit are turned on, and reducing the power consumption of the shift register unit.

Figure 7:
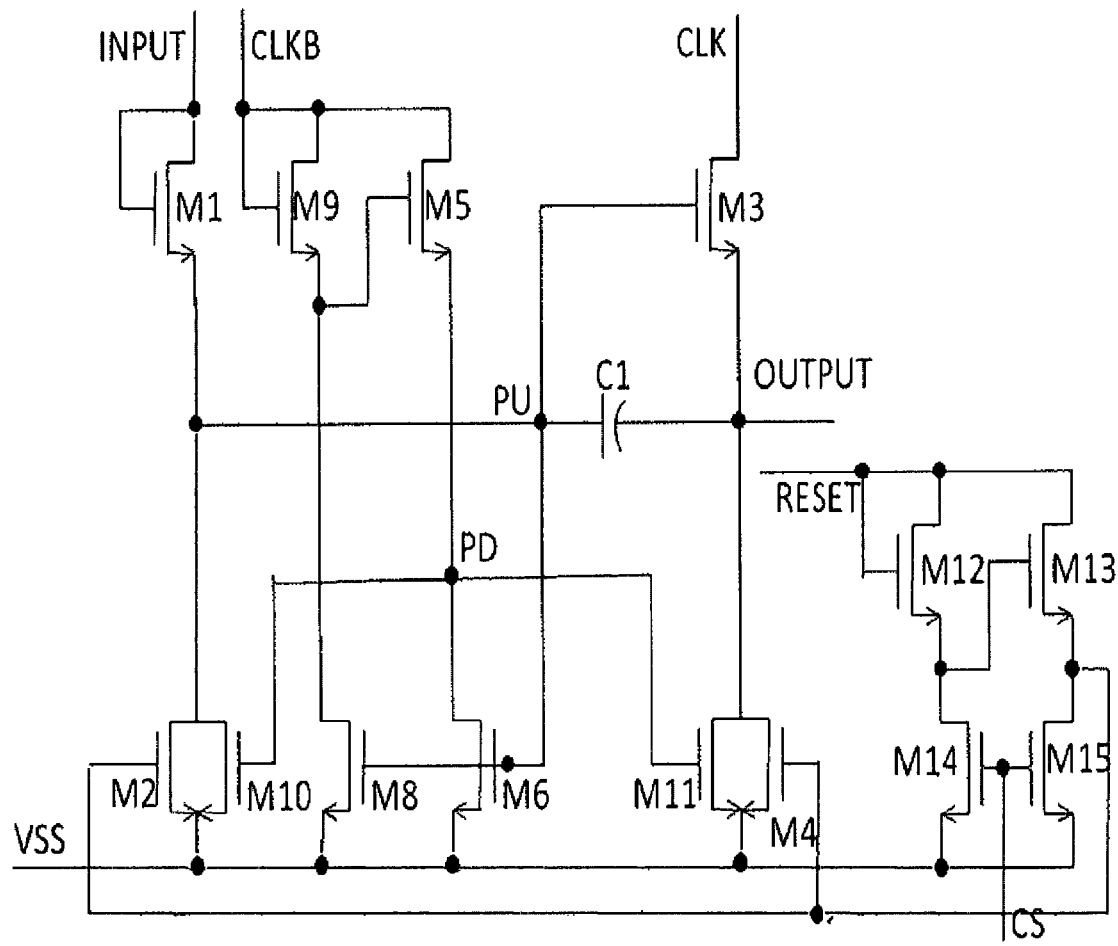
FIG. 7 is a diagram showing a second structure of a shift register unit according to an embodiment of the present disclosure.

As shown in FIG. 7, in a specific embodiment, the pre-charging module 1 may include:

a first TFT M1, a first electrode and a gate electrode of which are connected to the start signal input end (INPUT) and configured to receive a start signal (STV) for example, a signal outputted by a gate electrode signal output end of a previous level shift register unit; and a second electrode of which is connected to the first end of first capacitor C1, the pulling-up module 2 and the pulling-down module 4 respectively.

As shown in FIG. 7, the pulling-up module 2 may specifically include:

a third TFT M3, a first electrode of which is connected to the first clock signal input end (CLK) and configured to receive the first clock signal (CLK); a gate electrode of which is connected to the first end of the first capacitor C1, the pre-charging module 1 and the pulling-down module 4 respectively; and a second electrode of which is connected to the gate electrode signal output end (OUTPUT), a second end of the first capacitor C1 and the pulling-down module 4 respectively.

As shown in FIG. 7, the reset control module 3 may specifically include:

a twelfth TFT M12, a thirteenth TFT M13, a fourteenth TFT M14 and a fifteenth TFT M15; wherein a first electrode and a gate electrode of the twelfth TFT M12 are connected to the reset signal input end (RESET) and configured to receive the reset signal, for example, the signal outputted by a gate electrode signal end of a next level shift register unit; a second electrode of the twelfth TFT M12 is connected to a gate electrode of the thirteenth TFT M13 and a first electrode of the fourteenth TFT M14 respectively;

a first electrode of the thirteenth TFT M13 is connected to the reset signal input end, a second electrode of the thirteenth TFT M13 is connected to a first electrode of the fifteenth TFT M15 and the pulling-down module 4 respectively;

a gate electrode of the fourteenth TFT M14 is connected to the control signal input end (CS) and configured to receive a control signal, for example, a signal transmitted by the timing controller; a second electrode of the fourteenth TFT M14 is connected to the first level signal input end (VSS);

a gate electrode of the fifteenth TFT M15 is connected to the control signal input end, a second electrode of the fifteenth TFT M15 is connected to the first level signal input end.

As shown in FIG. 7, the pulling-down module 4 may specifically include:

a second TFT M2, a fourth TFT M4, a fifth TFT M5, a sixth TFT M6, an eighth TFT M8, a ninth TFT M9, a tenth TFT M10 and an eleventh TFT M11; wherein a first electrode of the second TFT M2 is connected to a gate electrode of the sixth TFT M6, a gate electrode of the eighth TFT M8, the pre-charging module 1, the first end of the first capacitor C1 and the pulling-up module 2 respectively, a gate electrode of the second TFT M2 is connected to the reset control module 3, and a second electrode of the second TFT M2 is connected to the first level signal input end;

a first electrode of the fourth TFT M4 is connected to the pulling-up module 2, a second end of the first capacitor C1 and the gate electrode signal output end respectively, a gate electrode of the fourth TFT M4 is connected to the reset control module 3, and a second electrode of the fourth TFT M4 is connected to the first level signal input end;

a first electrode of the fifth TFT M5 is connected to the second clock signal input end (CLKB) and configured to receive a second clock signal (CLKB), a gate electrode of the fifth TFT M5 is connected to a first electrode of the eighth TFT M8 and a second electrode of the ninth TFT M9 respectively, and a second electrode of the fifth TFT M5 is connected to a first electrode of the sixth TFT M6, a gate electrode of the tenth TFT M10 and a gate electrode of the eleventh TFT M11 respectively;

a second electrode of the sixth TFT M6 is connected to the first level signal input end;

a second electrode of the eighth TFT M8 is connected to the first level signal input end;

a first electrode and a gate electrode of the ninth TFT M9 are connected to the second clock signal input end;

a first electrode of the tenth TFT M10 is connected to the gate electrode of the sixth TFT M6, the gate electrode of the eighth TFT M8, the pre-charging module 1, the first end of the first capacitor C1 and the pulling-up module 2 respectively, and a second electrode the tenth TFT M10 is connected to the first level signal input end;

a first electrode of the eleventh TFT M11 is connected to the pulling-up module 2, the second end of the first capacitor C1 and the gate electrode signal output end respectively, and a second electrode of the eleventh TFT M11 is connected to the first level signal input end.

In a specific embodiment of the present disclosure, all the TFTs may be N-type TFTs. In this case, the first electrodes of the TFTs may be source electrodes and the second electrodes thereof may be drain electrodes.

In a specific embodiment of the present disclosure, the signal inputted by the first level signal input end may be of a low level signal, for example, the signal may have a potential less than zero.

In a specific embodiment of the present disclosure, the control signal configured to control the reset control module 3 may be either a chip select signal transmitted by the timing controller or other signal transmitted by other controller.

As shown in FIG. 8, an embodiment of the present disclosure further provides a method for driving the shift register unit. The method may include:

Step 81, charging, by the pre-charging module 1, the first capacitor C1 in a stage A, during which the pre-charging module 1 is in an ON state, the pulling-up module 2, the reset control module 3 and the pulling-down module 4 are in an OFF state;

Step 82, controlling, by the pulling-up module 2, the gate electrode signal output end to output the gate electrode driving signal in a stage B, during which the pulling-up module 2 is in an ON state, the pre-charging module 1, the reset control module 3 and the pulling-down module 4 are in an OFF state;

Step 83, controlling, by the reset control module 3, the pulling-down module 4 to be in an OFF state in a stage C, during which the reset control module 3 is in an ON state, the pre-charging module 1 and the pulling-up module 2 are in an OFF state, and the connecting TFT is in an ON state so that the gate electrode signal output end is electrically connected with the gate electrode signal output ends of other shift register units;

Step 84, controlling, by the pulling-down module 2, to pull down a potential of the gate electrode signal output end and to discharge the first capacitor C1, in a stage D, during which the reset control module 3 and the pulling-down module 4 are in an ON state, the pre-charging module 1 and the pulling-up module 2 are in an OFF state.

In an embodiment of the present disclosure, for the method for driving the shift register unit, a timing sequence of the signals inputted by respective signal input ends may be as shown in FIG. 2.

The process of the method for driving the shift register unit will be described below in detail with an example where the signal input timing sequence in FIG. 2 are used in the shift register unit as shown in FIG. 7.

In stage A, the start signal STV inputted by the start signal input end (INPUT) is of a high level signal; the first clock signal input end (CLK), the second clock signal input end (CLKB), the control signal input end (CS) and the reset signal input end (RESET) input low level signals. At this time, the pre-charging module 1 is in an ON state, that is, the TFT M1 is in an ON state; the pulling-up module 2, the reset control module 3 and the pulling-down module 4 are in an OFF state. The first capacitor C1 is pre-charged by the start signal STV.

In stage B, the first clock signal input end inputs a high level signal, the start signal input ends, the second clock signal input end, the control signal input end and the reset signal input end input low level signals. Because of the bootstrap effect of the first capacitor C1, the TFT M3 is in an ON state, that is, the pulling-up module 2 is in an ON state, so that the gate electrode signal output end outputs a gate electrode driving signal (Gn) having a high level. At this time, the pre-charging module 1, the reset control module 3 and the pulling-down module 4 are in an OFF state.

In stage C, the control signal input end inputs a control signal (CS) having a high level, the start signal input end and the reset signal input end input low level signals, the first clock signal input end the second clock signal input end are in high resistance states (Hi-Z), as shown by the hatched lines in FIG. 2. At this time, the fourteenth TFT M14 and the fifteenth TFT M15 in the reset control module 3 are in an ON state. Since there is no signal flowing into the first electrode, for example, the source electrode, of fourteenth TFT M14, then there is no signal flowing out from the second electrode, for example, the drain electrode, of fourteenth TFT M14. Since the second electrode of the fifteenth TFT M15 is connected to the first level signal input end, then when the fifteenth TFT M15 is in an ON state, the signal inputted by the first level signal input end is transmitted to gate electrodes of the second TFT M2 and the fourth TFT M4 in pulling-down module 4 via the fifteenth TFT M15. Since the signal inputted by the first level signal input end may be of a low level signal, the second TFT M2 and the fourth TFT M4 are in an OFF state at this time. In addition, the second clock signal input end is in the high resistance state at this time, therefore the pulling-down module is in an OFF state, that is, the power consumption of the shift register unit is reduced.

Furthermore, the control signal is a setting signal of a high level in stage C, therefore the connecting TFTs involved in an embodiment of the present disclosure (for example, the connecting TFTs T1 or T2 or the like as shown in FIG. 1) are in an ON state, thereby causing that the gate electrode signal output end of a level shift register unit is electrically connected to the gate electrode signal output ends of other shift register units. Therefore, electric charge sharing is achieved between gate electrode signal output ends of different shift register units; thereby the floating time of gate electrode signal output ends is achieved by using lower power consumption and the noise of the shift register is reduced.

In stage D, the second clock signal input end and the reset signal input end input high level signals, the start signal input end, the control signal input end and the first clock signal input end input low level signals. In a case that the signal inputted by the reset signal input end is of a high level, the twelfth TFT M12 and the thirteenth TFT M13 in the reset control module 3 are in an ON state, while the fourteenth TFT M14 and the fifteenth TFT M15 are in an OFF state. The high level signal inputted by the reset signal input end is transmitted to gate electrodes of the second TFT M2 and the fourth TFT M4 in the pulling-down module 4 via the thirteenth TFT M13, so that the second TFT M2 and the fourth TFT M4 are in an ON state. Moreover, since the second clock signal end inputs a high level signal, the ninth TFT M9 and the fifth TFT M5 are in an ON state. The second clock signal is transmitted to gate electrodes of the tenth TFT M10 and the eleventh TFT M11 via the fifth TFT M5; thereby the tenth TFT M10 and the eleventh TFT M11 are in an ON state. Therefore, in a case that the signal inputted by the first level signal input end is of a low level, that the second TFT M2 and the tenth TFT M10 are in ON states can pull down the potential of the PU node, that is, discharge the first capacitor C1, while that the fourth TFT M4 and the eleventh TFT M11 are in ON states can pull down the potential of the second end of the first capacitor and the potential of the gate electrode signal input end, that is, discharge the first capacitor C1 and lower the potential of the gate electrode signal input end, thereby achieving the reset process of the shift register unit.

The above is a working process of a level shift register unit in the shift register in a working cycle (for example, a time of one frame). With respect to other shift register units, the working process of the shift register can be achieved according to the above process and by using a gate electrode signal outputted by a previous level shift register unit as the start signal, and by using a gate electrode signal outputted by a next level shift register unit as the reset signal.

The shift register according to an embodiment of the present disclosure may include multi-level shift register units described in the above embodiments.

An embodiment of the present disclosure further provides a display device, The display device may include the shift register described above. Here, in the field of display technology, the display device may also be referred to a display apparatus or other electronic products having a display capability. The present disclosure is not limited thereto.

Specifically, the display device may be a liquid crystal panel, a liquid crystal TV, a liquid crystal display device, an organic light-emitting electrode (OLED) panel, an OLED display device, a plasma display device or electronic paper and the like.

The shift register unit, the shift register and the display device provided by embodiments of the present disclosure are particularly suitable for a Gate on array (GOA) circuit using a low-temperature polysilicon (LTPS) technology, and also can be suitable for a GOA circuit using an amorphous silicon technology.

It is noted that, in the above embodiments, the example in which only N-type TFTs are used has been described;

however, the above-described circuit may easily be modified to a circuit using only P-type TFTs or Complementary Metal Oxide Semiconductor (CMOS) transistors.

As can be seen from the above, according to the shift register, the method for driving the same, and the display device provided by the present disclosure, the shift register may specifically include multi-level shift register units, the first connecting TFT set and the second connecting TFT set. In the multi-level shift register units, control signal input ends of odd-number-level shift register units are inputted with the first control signal and control signal input ends of even-number-level shift register units are inputted with the second control signal; the connecting TFTs in the first connecting TFT set and the second connecting TFT set are configured to achieve the electrical connection between the gate electrode signal output ends of odd-number-level shift register units and even-number-level shift register units in the shift register under the control of the control signal transmitted by the timing controller, thereby shortening floating time of the gate electrode signal output end of the shift register unit, and reduce noise and power consumption of the shift register.

The above is only preferred embodiments of the present disclosure, it should be noted that several improvements and modifications may be made for a person skilled in the art without departing from the principle of the present disclosure, and also should be considered to fall within the protection scope of the present disclosure.

What is claimed is:

1. A shift register, comprising:
multi-level shift register units, in which control signal input ends of odd-number-level shift register units are inputted with a first control signal and control signal input ends of even-number-level shift register units are inputted with a second control signal;
a first connecting thin film transistor ("TFT") set, in which first electrodes of the TFTs in the first connecting TFT set are connected to gate electrode signal output ends of the odd-number-level shift register units, gate electrodes of TFTs in the first connecting TFT set are connected to a timing controller and configured to receive the first control signal transmitted by the timing controller, second electrodes of the TFTs in the first connecting TFT set are connected to gate electrode signal output ends of the even-number-level shift register units; and
a second connecting TFT set, in which first electrodes of the TFTs in the second connecting TFT set are connected to gate electrode signal output ends of the even-number-level shift register units, gate electrodes of TFTs in the second connecting TFT set are connected to the timing controller and configured to receive the second control signal transmitted by the timing controller, second electrodes of the TFTs in the second connecting TFT set are connected to gate electrode signal output ends of the odd-number-level shift register units,
wherein each shift register unit in the multi-level shift register units comprises:
a first capacitor, a pre-charging module, a pulling-up module, a reset control module and a pulling-down module; wherein
the pre-charging module is connected to a start signal input end, the pulling-down module, a first end of the first capacitor, the pulling-up module respectively, configured to pre-charge the first capacitor in a first stage;
the pulling-up module is connected to a first clock signal input end, the first capacitor, the pre-charging module, the pulling-down module and the gate electrode signal output end respectively, and configured to control the gate electrode signal output end to output a gate electrode driving signal in a second stage;
the reset control module is connected to a reset signal input end, a control signal input end, a first level signal input end, the pulling-down module respectively, and configured to control the pulling-down module to be in an OFF state in a third stage;
the pulling-down module is connected to a second clock signal input end, the first level signal input end, the gate electrode signal output end, the pre-charging module, the first capacitor, the pulling-up module and the reset control module respectively, and configured to control pulling down a potential of the gate electrode signal output end and discharging the first capacitor in a fourth stage.

2. The shift register according to claim 1, wherein the pre-charging module comprises:
a first TFT, a first electrode and a gate electrode of which are connected to the start signal input end, and a second electrode of which is connected to the first end of first capacitor, the pulling-up module and the pulling-down module respectively.

3. The shift register according to claim 1, wherein the pulling-up module comprises:
a third TFT, a first electrode of which is connected to the first clock signal input end, a gate electrode of which is connected to the first end of the first capacitor, the pre-charging module and the pulling-down module respectively, and a second electrode of which is connected to the gate electrode signal output end, a second end of the first capacitor and the pulling-down module respectively.

4. The shift register according to claim 1, wherein the reset control module comprises:
a twelfth TFT, a thirteenth TFT, a fourteenth TFT and a fifteenth TFT; wherein
a first electrode and a gate electrode of the twelfth TFT are connected to the reset signal input end, a second electrode of the twelfth TFT is connected to a gate electrode of the thirteenth TFT and a first electrode of the fourteenth TFT respectively;
a first electrode of the thirteenth TFT is connected to the reset signal input end, a second electrode of the thirteenth TFT is connected to a first electrode of the fifteenth TFT and the pulling-down module respectively;
a gate electrode of the fourteenth TFT is connected to the control signal input end, a second electrode of the fourteenth TFT is connected to the first level signal input end;
a gate electrode of the fifteenth TFT is connected to the control signal input end, a second electrode of the fifteenth TFT is connected to the first level signal input end.

5. The shift register according to claim 1, wherein the pulling-down module comprises:
a second TFT, a fourth TFT, a fifth TFT, a sixth TFT, an eighth TFT, a ninth TFT, a tenth TFT and an eleventh TFT; wherein
a first electrode of the second TFT is connected to a gate electrode of the sixth TFT, a gate electrode of the eighth TFT, the pre-charging module, the first end of the first capacitor and the pulling-up module respectively, a gate electrode of the second TFT is connected to the reset control module, and a second electrode of the second TFT is connected to the first level signal input end;

a first electrode of the fourth TFT is connected to the pulling-up module, a second end of the first capacitor and the gate electrode signal output end respectively, a gate electrode of the fourth TFT is connected to the reset control module, and a second electrode of the fourth TFT is connected to the first level signal input end;

a first electrode of the fifth TFT is connected to the second clock signal input end, a gate electrode of the fifth TFT is connected to a first electrode of the eighth TFT and a second electrode of the ninth TFT respectively, and a second electrode of the fifth TFT is connected to a first electrode of the sixth TFT, a gate electrode of the tenth TFT and a gate electrode of the eleventh TFT respectively;

a second electrode of the sixth TFT is connected to the first level signal input end;

a second electrode of the eighth TFT is connected to the first level signal input end;

a first electrode and a gate electrode of the ninth TFT are connected to the second clock signal input end;

a first electrode of the tenth TFT is connected to the gate electrode of the sixth TFT, the gate electrode of the eighth TFT, the pre-charging module, the first end of the first capacitor and the pulling-up module respectively, and a second electrode the tenth TFT is connected to the first level signal input end;

a first electrode of the eleventh TFT is connected to the pulling-up module, the second end of the first capacitor and the gate electrode signal output end respectively, and a second electrode of the eleventh TFT is connected to the first level signal input end.

6. The shift register according to claim 1, wherein all the TFTs are N-type TFTs, the first electrode of each of the TFTs is a source electrode and the second electrode of each of the TFTs is a drain electrode.

7. The shift register according to claim 1, wherein the first level signal input end inputs a low level signal.

8. The shift register according to claim 1, further comprising:

a switching TFT, a first electrode of which is connected to a second level signal input end, a gate electrode of which is connected to the timing controller and configured to receive a third control signal transmitted by the timing controller, and a second electrode of which is connected to the gate electrode signal output end of a first level shift register unit within the multi-level shift register units.

9. The shift register according to claim 8, wherein the first control signal is a first chip select signal, the second control signal is a second chip select signal, and the third control signal is a shutdown reset signal;

the second level signal input end inputs a high level signal.

10. A method for driving the shift register according to claim 1, the method comprising:

inputting, by a first clock signal input end, a high level signal; inputting, by a second clock signal input end, a low level signal; outputting, by a gate electrode signal output end of a first shift register unit, a gate electrode driving signal; and outputting, by gate electrode signal output ends of a second shift register unit and a third shift register unit, a low level signal, in a first stage, during which thin film transistors (TFTs) in the first connecting TFT set and the second connecting TFT set are in an OFF state;

achieving an electrical connection between the gate electrode signal output end of the first shift register unit and the gate electrode signal output end of the second shift register unit; and outputting, by the gate electrode signal output end of the third shift register unit, a low level signal, in a second stage, during which TFTs of the first connecting TFT set are in an ON state while TFTs of the second connecting TFT set are in an OFF state, and the first clock signal input end and the second clock signal input end are in a high resistance state;

inputting, by the first clock signal input end, a low level signal; inputting, by the second clock signal input end, a high level signal; outputting, by the gate electrode signal output end of the second shift register unit, the gate electrode driving signal; and outputting, by gate electrode signal output ends of the first shift register unit and the third shift register unit, a low level signal, in a third stage, during which TFTs in the first connecting TFT set and the second connecting TFT set are in an OFF state;

outputting, by the gate electrode signal output end of the first shift register unit, a low level signal; and achieving an electrical connection between the gate electrode signal output end of the second shift register unit and the gate electrode signal output end of the third shift register unit, in a fourth stage, during which TFTs in the first connecting TFT set are in an OFF state while TFTs in the second connecting TFT set are in an ON state, and the first clock signal input end and the second clock signal input end are in a high resistance state.

11. The method according to claim 10, further comprising:

setting the first control signal, the second control signal and the third control signal which are transmitted by the timing controller to be high level signals simultaneously, when the timing controller detects that an input power supply has a value lower than a predetermined value.

12. A display device, which comprises a shift register, the shift register comprising:

multi-level shift register units, in which control signal input ends of odd-number-level shift register units are inputted with a first control signal and control signal input ends of even-number-level shift register units are inputted with a second control signal;

a first connecting thin film transistor (TFT) set, in which first electrodes of the TFTs in the first connecting TFT set are connected to gate electrode signal output ends of the odd-number-level shift register units, gate electrodes of TFTs in the first connecting TFT set are connected to a timing controller and configured to receive the first control signal transmitted by the timing controller, second electrodes of the TFTs in the first connecting TFT set are connected to gate electrode signal output ends of the even-number-level shift register units; and a second connecting TFT set, in which first electrodes of the TFTs in the second connecting TFT set are connected to gate electrode signal output ends of the even-number-level shift register units, gate electrodes of TFTs in the second connecting TFT set are connected to the timing controller and configured to receive the second control signal transmitted by the timing controller, second electrodes of the TFTs in the second connecting TFT set are connected to gate electrode signal output ends of the odd-number-level shift register units, wherein each shift register unit in the multi-level shift register units comprises:

a first capacitor, a pre-charging module, a pulling-up module, a reset control module and a pulling-down module; wherein the pre-charging module is connected to a start signal input end, the pulling-down module, a first end of the first capacitor, the pulling-up module respectively, configured to pre-charge the first capacitor in a first stage;

the pulling-up module is connected to a first clock signal input end, the first capacitor, the pre-charging module, the pulling-down module and the gate electrode signal output end respectively, and configured to control the gate electrode signal output end to output a gate electrode driving signal in a second stage;

the reset control module is connected to a reset signal input end, a control signal input end, a first level signal input end, the pulling-down module respectively, and configured to control the pulling-down module to be in an OFF state in a third stage;

the pulling-down module is connected to a second clock signal input end, the first level signal input end, the gate electrode signal output end, the pre-charging module, the first capacitor, the pulling-up module and the reset control module respectively, and configured to control pulling down a potential of the gate electrode signal output end and discharging the first capacitor in a fourth stage.

13. The display device according to claim 12, wherein the pre-charging module comprises:

a first TFT, a first electrode and a gate electrode of which are connected to the start signal input end, and a second electrode of which is connected to the first end of first capacitor, the pulling-up module and the pulling-down module respectively.

14. The display device according to claim 12, wherein the pulling-up module comprises:

a third TFT, a first electrode of which is connected to the first clock signal input end, a gate electrode of which is connected to the first end of the first capacitor, the pre-charging module and the pulling-down module respectively, and a second electrode of which is connected to the gate electrode signal output end, a second end of the first capacitor and the pulling-down module respectively.

15. The display device according to claim 12, wherein the reset control module comprises:

a twelfth TFT, a thirteenth TFT, a fourteenth TFT and a fifteenth TFT; wherein a first electrode and a gate electrode of the twelfth TFT are connected to the reset signal input end, a second electrode of the twelfth TFT is connected to a gate electrode of the thirteenth TFT and a first electrode of the fourteenth TFT respectively;

a first electrode of the thirteenth TFT is connected to the reset signal input end, a second electrode of the thirteenth TFT is connected to a first electrode of the fifteenth TFT and the pulling-down module respectively;

a gate electrode of the fourteenth TFT is connected to the control signal input end, a second electrode of the fourteenth TFT is connected to the first level signal input end;

a gate electrode of the fifteenth TFT is connected to the control signal input end, a second electrode of the fifteenth TFT is connected to the first level signal input end.

16. The display device according to claim 12, wherein the pulling-down module comprises:

a second TFT, a fourth TFT, a fifth TFT, a sixth TFT, an eighth TFT, a ninth TFT, a tenth TFT and an eleventh TFT; wherein a first electrode of the second TFT is connected to a gate electrode of the sixth TFT, a gate electrode of the eighth TFT, the pre-charging module, the first end of the first capacitor and the pulling-up module respectively, a gate electrode of the second TFT is connected to the reset control module, and a second electrode of the second TFT is connected to the first level signal input end;

a first electrode of the fourth TFT is connected to the pulling-up module, a second end of the first capacitor and the gate electrode signal output end respectively, a gate electrode of the fourth TFT is connected to the reset control module, and a second electrode of the fourth TFT is connected to the first level signal input end;

a first electrode of the fifth TFT is connected to the second clock signal input end, a gate electrode of the fifth TFT is connected to a first electrode of the eighth TFT and a second electrode of the ninth TFT respectively, and a second electrode of the fifth TFT is connected to a first electrode of the sixth TFT, a gate electrode of the tenth TFT and a gate electrode of the eleventh TFT respectively;

a second electrode of the sixth TFT is connected to the first level signal input end;

a second electrode of the eighth TFT is connected to the first level signal input end;

a first electrode and a gate electrode of the ninth TFT are connected to the second clock signal input end;

a first electrode of the tenth TFT is connected to the gate electrode of the sixth TFT, the gate electrode of the eighth TFT, the pre-charging module, the first end of the first capacitor and the pulling-up module respectively, and a second electrode the tenth TFT is connected to the first level signal input end;

a first electrode of the eleventh TFT is connected to the pulling-up module, the second end of the first capacitor and the gate electrode signal output end respectively, and a second electrode of the eleventh TFT is connected to the first level signal input end.

17. The display device according to claim 12, wherein all the TFTs are N-type TFTs, the first electrode of each of the TFTs is a source electrode and the second electrode of each of the TFTs is a drain electrode.

18. The display device according to claim 12, wherein the first level signal input end inputs a low level signal.

19. A shift register, comprising:

multi-level shift register units, in which control signal input ends of odd-number-level shift register units are inputted with a first control signal and control signal input ends of even-number-level shift register units are inputted with a second control signal;

a first connecting thin film transistor (TFT) set, in which first electrodes of the TFTs in the first connecting TFT set are connected to gate electrode signal output ends of the odd-number-level shift register units, gate electrodes of TFTs in the first connecting TFT set are connected to a timing controller and configured to receive the first control signal transmitted by the timing controller, second electrodes of the TFTs in the first connecting TFT set are connected to gate electrode signal output ends of the even-number-level shift register units;

a second connecting TFT set, in which first electrodes of the TFTs in the second connecting TFT set are connected to gate electrode signal output ends of the even-number-level shift register units, gate electrodes of TFTs in the second connecting TFT set are connected to the timing controller and configured to receive the second control signal transmitted by the timing controller, second electrodes of the TFTs in the second connecting TFT set are connected to gate electrode signal output ends of the odd-number-level shift register units, and a switching TFT, a first electrode of which is connected to a second level signal input end, a gate electrode of which is connected to the timing controller and configured to receive a third control signal transmitted by the timing controller, and a second electrode of which is connected to the gate electrode signal output end of a first level shift register unit within the multi-level shift register units.

20. The shift register according to claim 19, wherein the first control signal is a first chip select signal, the second control signal is a second chip select signal, and the third control signal is a shutdown reset signal;

the second level signal input end inputs a high level signal.

* * * * *